United States Patent [19]

Bauer et al.

[11] Patent Number: 4,475,036

[45] Date of Patent: Oct. 2, 1984

[54] DUAL PHOTOELECTRIC CELL ASSEMBLY

[75] Inventors: Frederick T. Bauer; Jon H. Bechtel, both of Holland, Mich.

[73] Assignee: Gentex Corporation, Zeeland, Mich.

[21] Appl. No.: 295,770

[22] Filed: Aug. 24, 1981

[51] Int. Cl.³ .......... H01J 5/16; H01J 5/30

[52] U.S. Cl. .......... 250/239; 350/299

[58] Field of Search .......... 250/203 R, 239, 203 S, 250/573–575; 350/299, 300

[56] References Cited

U.S. PATENT DOCUMENTS 3,226,557 12/1965 Goodman .......... 250/239

3,654,475 4/1972 Montpas .......... 250/203 R 3,777,160 12/1973 Bernt .......... 250/203 R X

*Primary Examiner*—Edward P. Westin

*Attorney, Agent, or Firm*—Malcolm R. McKinnon

[57] ABSTRACT

A dual photoelectric cell assembly incorporating a unitary dual element photoelectric cell having first and second light sensing areas, the assembly also including a plurality of light reflecting surfaces. The dual element photoelectric cell and the reflecting surfaces are potted in transparent potting compound in a transparent housing whereby light emanating from a first direction is reflected onto the first light sensing area of the dual element photoelectric cell and light emanating from a second direction is reflected onto the second light sensing area of the dual element photoelectric cell.

10 Claims, 6 Drawing Figures

FIG. 1.
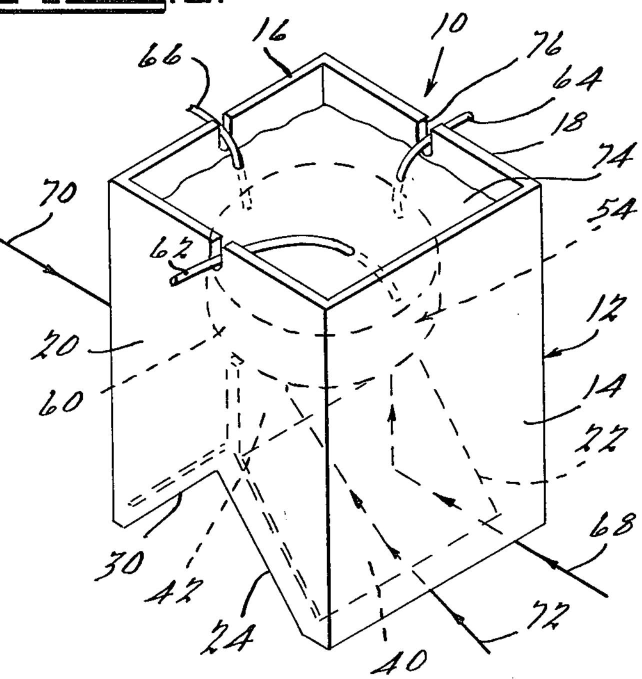
FIG. 2.
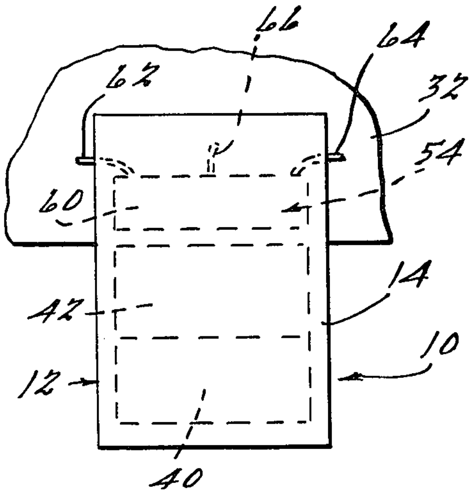
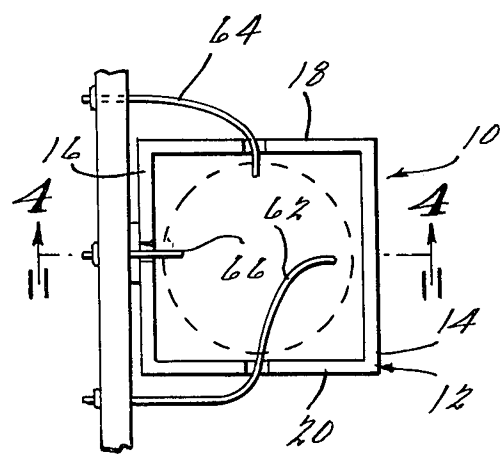
FIG. 3.
FIG. 4.
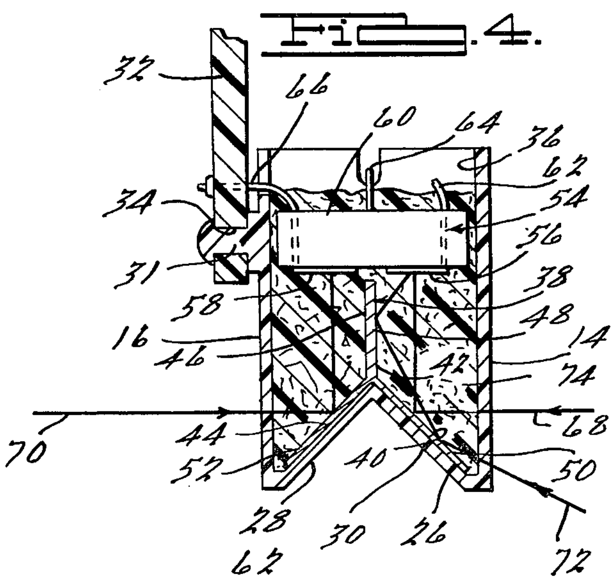
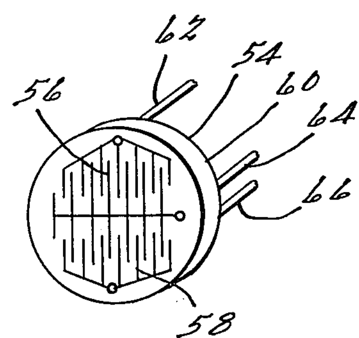
FIG. 5.
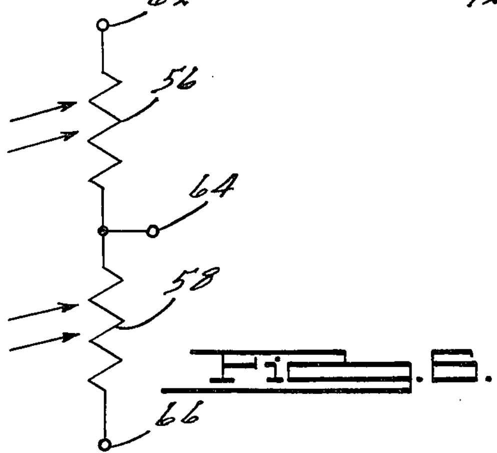
FIG. 6.

DUAL PHOTOELECTRIC CELL ASSEMBLY

BRIEF SUMMARY OF THE INVENTION

This invention relates to photoelectric cells, and, more particularly, to an improved dual photoelectric cell assembly incorporating improved means for directing light emanating from different directions onto separate light sensing areas of a unitary dual element photoelectric cell embodied in the assembly. While the present invention is particularly adapted for use with automatic rearview mirrors for automotive vehicles, it will be understood that the present invention is applicable to other uses such as, for example, in photoelectric type smoke detectors.

As is well known in the art, heretofore automatic rearview mirrors for automotive vehicles have been provided which incorporate two or more separate photoelectric cells that sense light emanating from different directions, such as from the front of the vehicle and from the rear of the vehicle, and means is provided to shift the mirror from a full reflectance mode to a partial reflectance mode when annoying glare emanating from the rear of the vehicle is sensed by the photoelectric cells. While the use of separate photoelectric cells provides satisfactory results, the cost of multiple cell assemblies is relatively high since provision must be made, for example, to compensate for variations in the temperature coefficients of the separate cells as well as aging of the separate cells. Heretofore dual element photoelectric cells having two independent light sensing areas have been commercially available and such dual photoelectric cells are normally less expensive than a pair of single photoelectric cells. While such dual element photoelectric cells are commercially available both in hermetically sealed cases and in less expensive plastic packages, both types are subject to a number of deficiencies. For example, the plastic packages require additional protection from moisture in many applications while the glass and metal cases of the hermetically sealed units have considerable distance between the window thereof and the light sensing area. Consequently, it is difficult to direct light from one source to its intended sensing area on the cell face without having the light strongly illuminate the other sensing area as well, and cross-talk tends to be very high. Another problem in the application of dual element photoelectric cells arises from the fact that both sensing areas are on the same cell face, and in order to sense light emanating from directions separated by a large angle, it is necessary to reflect, scatter or refract the light emanating from at least one direction in order to direct the light onto the cell face. Such directing means must be secured and aligned in proper relationship with respect to the cell, and multiple optical surfaces, each of which may become dirty with time or clouded with condensation, are also unacceptable from a practical standpoint.

An object of the present invention is to overcome the aforementioned as well as other disadvantages in prior photoelectric devices of the indicated character, and to provide an improved dual photoelectric cell assembly incorporating a dual element photoelectric cell and improved means for directing light emanating from different directions onto different light sensing areas of the dual element photoelectric cell.

Another object of the present invention is to provide an improved dual photoelectric cell assembly which is economically and commercially feasible to manufacture and assemble, strong and rugged in construction, mechanically shock resistant, durable, efficient and reliable in operation.

Another object of the present invention is to provide an improved dual photoelectric cell assembly incorporating improved protection for a dual element photoelectric cell embodied therein against moisture, dust, dirt and other foreign matter.

Another object of the present invention is to provide an improved dual photoelectric cell assembly wherein the only optical surfaces subject to contamination are accessible for cleaning by the user of the device.

The above as well as other objects and advantages of the present invention will become apparent from the following description, the appended claims and the accompanying drawings.

BRIEF DESCRIPTION OF THE DRAWINGS

FIG. 1 is a perspective view of a dual photoelectric cell assembly embodying the present invention;

FIG. 2 is an elevational view of the dual photoelectric cell assembly illustrated in FIG. 1, taken from the right of FIG. 1, and showing the assembly secured to a printed circuit board;

FIG. 3 is a top plan view of the structure illustrated in FIG. 2;

FIG. 4 is a sectional side elevational view of the structure illustrated in FIG. 3, taken on the line 4—4 thereof;

FIG. 5 is a perspective view of the dual element photoelectric cell embodied in the structure illustrated in FIGS. 1 through 4; and FIG. 6 is an electrical schematic diagram of the dual element photoelectric cell illustrated in FIG. 5.

DETAILED DESCRIPTION

Referring to the drawings, a preferred embodiment of the invention is illustrated therein, and is comprised of a dual photoelectric cell assembly, generally designated 10, which is particularly adapted for use with automatic rearview mirrors for automotive vehicles. For example, the dual photoelectric cell assembly 10 may be incorporated in the automatic rearview mirror disclosed and claimed in U.S. application Ser. No. 268,660, filed June 1, 1981 and entitled "Automatic Rearview Mirror for Automotive Vehicles", it being understood that the present invention is also applicable to other uses, such as, for example, in photoelectric type smoke detectors.

The dual photoelectric cell assembly 10 is comprised of a transparent housing, generally designated 12, having substantially rectangular front and rear walls 14 and 16, respectively, integrally joined by side walls 18 and 20 defining generally inverted V-shaped recesses 22 and 24 opening on opposite sides of the housing. The housing 12 also includes integral, oppositely angularly inclined, substantially rectangular bottom walls 26 and 28 whereby the side walls 18 and 20 and the oppositely angularly inclined bottom walls 26 and 28 define a generally inverted V-shaped passageway 30 which is open at the bottom and at the opposite sides of the housing. The transparent housing 12 is preferably formed of transparent thermoplastic material such as acrylic or styrene, although it will be understood that other transparent materials may be utilized if desired.

In the embodiment of the invention illustrated, as shown in FIGS. 3 and 4, a mounting post 31 is provided which is preferably formed integrally with the back wall 16 of the housing. The mounting post 31 may be utilized to mount the housing 12 on a circuit board 32, or other support, by heat staking the mounting post after it has been inserted through an opening 34 in the circuit board or other support. The housing 12 defines a chamber 36 which is open at the top, as viewed in FIGS. 1, 2 and 4, the chamber 36 being adapted to receive a reflective member, generally designated 38, which is generally inverted Y-shaped in vertical cross section as illustrated in FIG. 4. The reflective member 38 includes generally rectangular reflective surfaces 40, 42, 44 and 46 thereon. In the embodiment of the invention illustrated, the reflective surfaces 42 and 46 are disposed in spaced substantially vertical planes while the reflective surfaces 40 and 44 are oppositely angularly inclined with respect to each other and extend at an angle of approximately 45 degrees with respect to the spaced parallel planes of the reflective surfaces 42 and 46.

The reflective member 38 is adapted to nest with and be supported by the inner surfaces of the oppositely angularly inclined bottom walls 26 and 28 of the housing whereby the upstanding portion 48 of the reflective member 38 projects vertically upwardly from the apex formed by the junction of the bottom walls 26 and 28 while the oppositely angularly inclined portions 50 and 52 of the reflective member 38 are disposed adjacent the inner surfaces of the oppositely angularly inclined bottom walls 26 and 28, respectively of the housing.

A conventional dual element photoelectric cell 54 is provided having independent light sensing areas 56 and 58 thereon, the light sensing areas 56 and 58 preferably being formed on the same substrate. The dual element photoelectric cell 54 may be of either the hermetically sealed type or the plastic package type and may be mounted in a generally cup shaped case 60. The independent light sensing areas 56 and 58 of the dual element photoelectric cell are electrically connected to leads 62, 64 and 66 which may be attached to any desired circuitry on the printed circuit board in any desired or conventional manner. The light sensing areas 56 and 58 are preferably photo-resistive, that is, the electrical resistance of the areas 56 and 58 decreases with increasing levels of light impinging thereon. It will be understood that other types of light sensors may be utilized, as for example, photo-voltaic devices.

The dual element photoelectric cell 54 is disposed in the chamber 36 defined by the housing 12 so that the light sensing areas 56 and 58 face the reflective member 38 with the light sensing area 56 being disposed on one side of the upstanding portion 48 of the reflective member while the light sensing area 58 is disposed on the opposite side of the upstanding portion 48 of the reflective member.

The reflective surface 40 directs light rays such as 68 emanating from in front of the housing to the light sensing area 56 of the dual element photoelectric cell while the reflective surface 44 directs light rays such as 70 emanating from in back of the housing onto the light sensing area 58 of the dual element photoelectric cell. The reflective surfaces 40 and 42 and the reflective surfaces 44 and 46 are configured to concentrate off axis rays, such as 72, to direct them onto the proper sensing area and to direct them away from the other sensing area. This feature is utilized to particular advantage with hermetically sealed cells since with such cells the window thereof makes it necessary to provide a relatively large distance between the top of the reflective surfaces and the associated sensing areas on the cell. While in the preferred embodiment of the invention illustrated, concentration of the light has been accomplished by a single junction between the reflective surfaces 40 and 42 and a single junction between the reflective surfaces 44 and 46 whereby multiple reflections of off axis rays such as 72 may take place, it will be understood that other light concentrating means using multiple reflective surface junctures, curved mirror surfaces and other shaped surfaces on the exterior of the housing or at the interface of the housing with a transparent potting compound 74 (which will be described hereinafter in greater detail) may also be utilized separately or in combination. The reflective surfaces 40, 42, 44 and 46 may, if desired, be replaced by diffused reflecting surfaces, and may in either case be incorporated as part of the housing 12 rather than on a separate reflective element. Moreover, it is not necessary that the reflective surfaces be symmetrical.

The photoelectric cell 54 and the interior optical surfaces are protected by the transparent potting compound 74 which may, for example, be a commercially available silicone elastomer, although it will be understood that other transparent potting compounds or encapsulating materials may be utilized. The reflective element 38 and the photoelectric cell 54 are encapsulated in the potting compound 74 in the chamber 36 defined by the housing 12 whereby the photoelectric cell and the reflecting surfaces on the reflective element 38 are held in accurate relationship with respect to each other in the chamber defined by the housing thereby minimizing dimensional tolerance problems. The potting compound also provides additional protection for a non-hermetically sealed dual element photoelectric cell, and the cell and the interior reflecting surfaces are protected from contamination from dust, dirt, moisture and other foreign matter. The outer surfaces of the housing through which light enters serve as windows which are readily accessible for cleaning by the user of the device if such surfaces become contaminated.

If desired, the upper portions of the walls of the housing may be provided with notches, such as 76 to permit easy egress of the leads 62, 64 and 66 from the housing.

While a preferred embodiment of the invention has been illustrated and described, it will be understood that various changes and modifications may be made without departing from the spirit of the invention.

What is claimed is:

1. A dual photoelectric cell assembly comprising, in combination, a housing defining a chamber and having at least two walls thereof formed of a light transmitting material, a unitary photoelectric cell having first and second independent light sensing areas formed on the same substrate and disposed in the chamber defined by said housing, light reflecting means disposed in the chamber defined by said housing and effective to reflect light emanating from a first direction only onto said first light sensing area and to reflect light emanating from a second direction generally opposite said first direction only onto said second light sensing area, and means capable of transmitting light and encapsulating said cell and said light reflecting means in the chamber defined by said housing.

2. The combination as set forth in claim 1 wherein said light reflecting means includes a plurality of angularly disposed light reflecting surfaces.

3. The combination as set forth in claim 1 wherein said light reflecting means includes a light reflecting member having a pair of spaced substantially parallel oppositely directed light reflecting surfaces and a pair of spaced oppositely angularly disposed light reflecting surfaces.

4. The combination as set forth in claim 1 including support means formed integrally with one of said walls of said housing.

5. The combination as set forth in claim 1 wherein the electrical resistance of said light sensing areas decreases with increasing levels of light impinging thereon.

6. A dual photoelectric cell assembly comprising, in combination, a housing having transparent front and rear walls integrally joined by spaced sidewalls and integral oppositely inclined bottom walls and defining an open top chamber, a reflective member disposed in the chamber defined by said housing, said reflective member including a pair of substantially vertical reflective surfaces and a pair of oppositely angularly inclined reflective surfaces, said reflective member nesting with said bottom walls of said chamber, a unitary dual element photoelectric cell having independent first and second light sensing areas formed on the same substrate and disposed in the chamber defined by said housing whereby one of said vertical reflective surfaces and one of said angularly inclined reflective surfaces reflect light emanating from a first direction only onto said first light sensing area and the other of said vertical reflective surfaces and the other of said angularly inclined reflective surfaces reflect light emanating from a second direction generally opposite said first direction only onto said second light sensing area, and means formed of a light transmitting material encapsulating said photoelectric cell and said reflective member in the chamber defined by said housing.

7. The combination as set forth in claim 6 including support means formed integrally with one of said walls of said housing.

8. The combination as set forth in claim 6 wherein the electrical resistance of said light sensing areas decreases with increasing levels of light impinging thereon.

9. The combination as set forth in claim 8 wherein said housing is formed of transparent thermoplastic material.

10. The combination as set forth in claim 9 wherein said encapsulating means is a silicone elastomer.

* * * * *